(12) United States Patent
Chai

(10) Patent No.: US 12,210,054 B2
(45) Date of Patent: Jan. 28, 2025

(54) METHOD FOR ACCURATE REFERENCE VOLTAGE TRIMMING

(71) Applicant: TEXAS INSTRUMENTS INCORPORATED, Dallas, TX (US)

(72) Inventor: Kar Hou Chai, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 145 days.

(21) Appl. No.: 18/070,534

(22) Filed: Nov. 29, 2022

(65) Prior Publication Data

US 2024/0175913 A1    May 30, 2024

(51) Int. Cl.
  *G01R 31/28* (2006.01)
  *G01R 27/02* (2006.01)

(52) U.S. Cl.
  CPC ......... *G01R 31/2834* (2013.01); *G01R 27/02* (2013.01); *G01R 31/2886* (2013.01)

(58) Field of Classification Search
  CPC ............... G01R 31/2834; G01R 27/02; G01R 31/2886; G01R 31/26
  USPC ........................................ 324/762.01, 750.3
  See application file for complete search history.

(56) References Cited

U.S. PATENT DOCUMENTS

| | | | | |
|---|---|---|---|---|
| 6,194,909 B1* | 2/2001 | Belforte | ................... | H04M 3/26 324/73.1 |
| 6,472,897 B1* | 10/2002 | Shyr | ................... | H03M 1/1014 257/529 |
| 6,605,956 B2* | 8/2003 | Farnworth | ..... | G01R 31/318513 365/201 |
| 2002/0105847 A1* | 8/2002 | Kono | ...................... | G11C 29/12 365/226 |
| 2005/0093564 A1* | 5/2005 | Bucksch | .......... | G01R 31/31901 324/762.01 |
| 2009/0122634 A1* | 5/2009 | Kang | ...................... | G11C 5/147 365/226 |
| 2021/0080498 A1* | 3/2021 | Tadepalli | ........... | G01R 31/2837 |

\* cited by examiner

*Primary Examiner* — Tung X Nguyen
*Assistant Examiner* — Robert P Alejnikov, Jr.
(74) *Attorney, Agent, or Firm* — Ronald O. Neerings; Frank D. Cimino

(57) ABSTRACT

One example includes a method for trimming a reference voltage in an integrated circuit (IC). The method includes fabricating the IC that is configured to generate the reference voltage based on a circuit design. The fabricated IC includes a pair of conductive input/output (I/O) leads and a resistance test switch system coupled between the conductive I/O leads. The method also includes coupling the conductive I/O leads of the fabricated IC to a circuit test fixture and setting the resistance test switch system to a test mode via automated testing equipment (ATE) associated with the circuit test fixture. The method also includes providing a test signal to the conductive I/O leads and measuring a resistance between the conductive I/O leads in response to the test signal. The method further includes trimming the reference voltage based on the measured resistance.

20 Claims, 4 Drawing Sheets

METHOD FOR ACCURATE REFERENCE VOLTAGE TRIMMING

TECHNICAL FIELD

This description relates generally to electronic test systems, and more particularly to a method for accurate reference voltage trimming.

BACKGROUND

Electronic circuits implement direct current (DC) voltages for a variety of purposes. As an example, a switching power converter can be configured to generate a stable output voltage based on a comparison of the output voltage (e.g., a proportionally stepped-down version of the output voltage) with a reference voltage. A reference voltage can be generated from dedicated circuitry, such that the used for several different functions in electronic circuits (e.g., different chips in an electronic device). Thus, the reference voltage can be provided in a stable and accurate manner to provide for proper operation of the associated receiving electronic circuits. To ensure an accurate amplitude of the reference voltage, the reference voltage generator (e.g., the chip that provides the reference voltage) can be tested after fabrication. If the reference voltage amplitude varies, the reference voltage generator can be trimmed, such that the amplitude of the reference voltage generated by the reference voltage generator can be adjusted to be provided at the correct amplitude.

SUMMARY

One example includes a method for trimming a reference voltage in an integrated circuit (IC). The method includes fabricating the IC that is configured to generate the reference voltage based on a circuit design. The fabricated IC includes a pair of conductive input/output (I/O) leads and a resistance test switch system coupled between the conductive I/O leads. The method also includes coupling the conductive I/O leads of the fabricated IC to a circuit test fixture and setting the resistance test switch system to a test mode via automated testing equipment (ATE) associated with the circuit test fixture. The method also includes providing a test signal to the conductive I/O leads and measuring a resistance between the conductive I/O leads in response to the test signal. The method further includes trimming the reference voltage based on the measured resistance.

Another example described herein includes an integrated circuit IC. The IC includes a reference voltage generator configured to provide a reference voltage, a first conductive I/O lead on which the reference voltage is provided during a normal operating mode, and a second conductive I/O lead. The IC also includes a resistance test switch system comprising a set of switches coupled to the reference voltage generator and the first and second conductive I/O leads and a control register that is adapted to be coupled to ATE to control the set of switches between the normal operating mode and a test mode. The IC further includes a trim memory configured to save a trimming value associated with the reference voltage provided via the ATE in response to a determination of a resistance between the first and second I/O leads during the test mode via a circuit test fixture.

Another example described herein includes a method for fabricating an integrated circuit IC. The method includes forming an IC die. The IC die includes a reference voltage generator configured to provide a reference voltage, a first conductive I/O lead on which the reference voltage is provided during a normal operating mode, and a second conductive I/O lead. The IC also includes a resistance test switch system comprising a set of switches coupled to the reference voltage generator and the first and second conductive I/O leads and a control register that is adapted to be coupled to ATE to control the set of switches between the normal operating mode and a test mode. The IC further includes a trim memory configured to save a trimming value associated with the reference voltage provided via the ATE in response to a determination of a resistance between the first and second I/O leads during the test mode via a circuit test fixture. The method also includes enclosing the IC die in an IC package. The IC package includes a first pin conductively coupled to the first conductive I/O lead and a second pin conductively coupled to the second conductive I/O lead.

DETAILED DESCRIPTION

Figure 1:
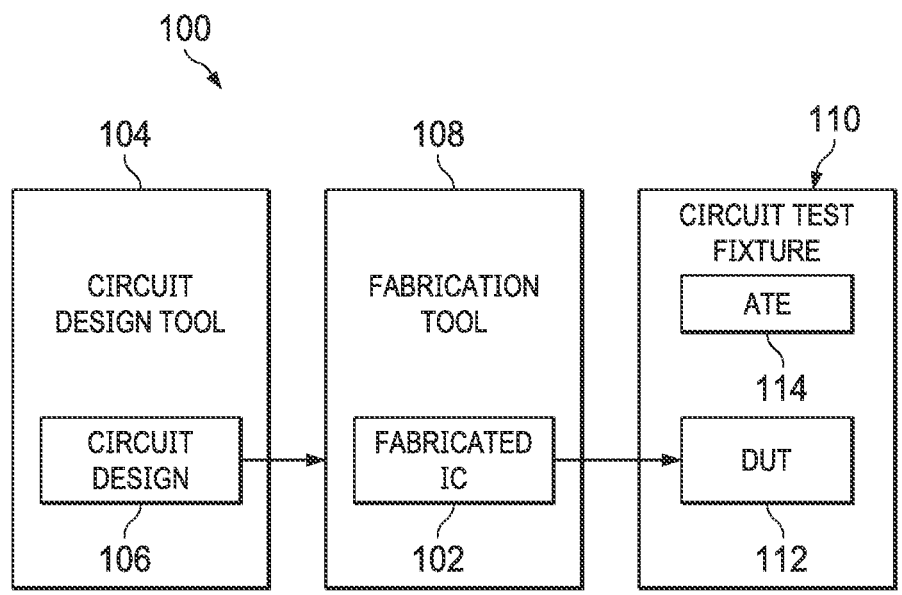
FIG. 1 is an example block diagram of trimming a reference voltage in an integrated circuit (IC).

This description relates generally to electronic systems and, more particularly, to a method for accurate reference voltage trimming. An integrated circuit (IC) that includes a reference voltage generator can be fabricated. The IC can also include a pair of input/output (I/O) leads, a control register, a trim memory, and a resistance test switch system. After fabrication of the IC, the I/O leads can be coupled to a circuit test fixture for testing. As an example, a first I/O lead of the I/O leads can be coupled to the reference voltage generator, such that the reference voltage is provided on the respective first I/O lead during a normal operating mode of the IC. The circuit test fixture can provide the trimming of the reference voltage generator to provide an accurate amplitude of the reference voltage.

As described herein, the term "trimming" with respect to the reference voltage generator, or with respect to the reference voltage, refers to measuring the amplitude of the reference voltage on the first I/O lead via a probe coupled to the first I/O lead. For example, the circuit test fixture can include automated test equipment (ATE) that can be communicatively coupled with the control register of the IC. Thus, if the measured amplitude of the reference voltage is not equal to a desired amplitude, the operation of trimming also includes adjusting the amplitude of the reference voltage via the ATE to be approximately equal to the desired amplitude. For example, the ATE can set a trim value in the trim memory of the IC to provide a digital adjustment to the amplitude of the reference voltage, as provided by the reference voltage generator.

As described above, in a trimming operation, the measurement of the reference voltage is based on measurement of the reference voltage at the first I/O lead via a probe of the circuit test fixture. Therefore, the measurement of the reference voltage can be affected by a variety of factors that can provide an error in the measured amplitude of the reference voltage. For example, contact resistance on the probe can increase a resistance between the first I/O lead and the probe, resulting in a reduced amplitude of the reference voltage. As a result, an error in the measured amplitude of the reference voltage can result in a trimming value that is offset from the desired amplitude. Accordingly, the resistance test switch system can be implemented to determine a resistance at the first I/O lead to determine an accurate amplitude of the reference voltage, and therefore to provide accurate trimming of the reference voltage.

As an example, the resistance test switch system can include a set of switches that can be controlled between a test mode and a normal operating mode. For example, the circuit test fixture can include automated test equipment (ATE) that can be communicatively coupled with the control register of the IC to switch the resistance test switch system between the test mode and the normal operating mode. Thus, in response to the I/O leads being coupled to the circuit test fixture, the ATE can switch the resistance test switch system to the test mode. In the test mode, a first switch can decouple the reference voltage generator and the first I/O lead and can couple the first I/O lead to a second I/O lead via a resistor. The circuit test fixture can thus provide a signal (e.g., a current) through the resistor between the first and second I/O leads to measure a resistance of the first and second I/O leads.

In response to determining that the measured resistance is approximately the same as the resistor, the circuit test fixture can determine that there is minimal contact resistance between the probe and the first I/O lead, thereby allowing accurate measurement of the reference voltage for accurate trimming of the reference voltage. However, if the circuit fixture determines that the measured resistance is different (e.g., greater) than the resistor, then the circuit test fixture can determine that there is added resistance between the first I/O lead and the probe, thereby prompting an adjustment of the hardware (e.g., cleaning the probe). Accordingly, the resistance test switch system provides for a manner of accurately trimming the reference voltage by detecting and thereby mitigating the effect of additional resistance between probe(s) of the circuit test fixture and the first I/O lead.

FIG. 1 is an example diagram 100 of trimming a reference voltage in an integrated circuit (IC). The diagram 100 is demonstrated as including functional blocks that are representative of the steps and flow of how the IC, demonstrated at 102, is fabricated and tested during a test mode, such as to facilitate trimming of a reference voltage generated by the IC 102. The diagram 100 includes a circuit design tool 104 that is configured to facilitate design of the IC 102 by a user. The circuit design tool 104 is thus configured to generate a circuit design 106 that corresponds to the design of the IC 102. The circuit design tool 104 can correspond to a software program or a computer terminal on which the user can provide inputs to generate the circuit design 106. As an example, the circuit design 106 can be provided as a software file or set of files that describe the physical layout and/or operational characteristics of the IC 102.

The diagram 100 also includes a fabrication tool 108 that is configured to receive the circuit design 106 and to fabricate the IC 102. As an example, the fabrication tool 108 can be any of a variety of fabrication tools that can fabricate ICs. The fabricated IC 102 includes a reference voltage generator that is configured to provide a reference voltage as an output on a first I/O lead. The IC 102 can also include additional I/O leads, a control register, a trim memory, and a resistance test switch system, as described in greater detail herein. As described herein, the fabricated IC 102 can be arranged as an IC die. The fabricated IC 102 can be one of a plurality of fabricated circuits, such as arranged on a wafer. As another example, the fabricated IC 102 can be arranged as an IC package that encloses the IC die therein. Thus, the I/O leads can refer to conductive I/O pads on the IC die and/or conductive pins on the IC package. The conductive I/O can be adapted to be coupled to external components, such as provided by an end user. The external components can include any of a variety of circuit components, such as resistors, inductors, capacitors, etc., that can be coupled to the conductive I/O.

The diagram 100 also includes a circuit test fixture 110 that can correspond to any of a variety of circuit testing devices that can probe and measure the conductive I/O of the fabricated IC 102. In the example of FIG. 1, the fabricated IC 102 is provided as a device-under-test (DUT) 112 to the circuit test fixture 110, such that the conductive I/O of the fabricated IC 102 can be coupled to the conductive probes of the circuit test fixture 110. The circuit test fixture 110 can thus provide electrical signals to the DUT 112 to monitor voltages and currents at the conductive I/O of the DUT 112 to determine the measurable parameters of the fabricated IC 102. For example, the application of the electrical signals can be provided during a design validation/verification stage of the fabricated IC 102. In the example of FIG. 1, the circuit test fixture 110 also includes automated test equipment (ATE) 114 that can communicate with a control register of the DUT 112 to switch the DUT 112 between a normal operating mode and a test mode.

As described herein, the circuit test fixture 110 can be configured to perform trimming with respect to the reference voltage generator of the DUT 112. For example, the ATE 114 can switch the DUT 112 to the test mode to measure a resistance between the probes of the circuit test fixture 110 and the DUT 112, as described in greater detail herein. In response to determining minimal additional resistance between the probes of the circuit test fixture 110 and the DUT 112, the ATE 114 can switch the DUT 112 to the normal operating mode and measure the amplitude of the reference voltage. The circuit test fixture 110 can thus perform trimming on the reference voltage, as is typically provided (e.g., via the ATE 114 saving a trim value in the trim memory of the DUT 112).

However, a significant additional resistance between the probes of the circuit test fixture 110 and the DUT 112 could affect the subsequent measurement of the reference voltage via the circuit test fixture 110, such that the additional resistance can result in an erroneous amplitude of the reference voltage. Such an erroneous measurement can result in a correspondingly erroneous trim value applied to the reference voltage. Therefore, in response to the circuit test fixture 110 determining a significant additional resistance, as an example, the circuit test fixture can prompt the user(s) to adjust the hardware of the circuit test fixture 110. For example, the user(s) can clean the hardware probes of the circuit test fixture 110, determine efficacy of the hardware of the circuit test fixture 110 (e.g., determine proper operation, etc.). As another example, in response to the circuit test fixture 110 determining a significant additional resistance, the circuit test fixture 110 can adjust the trim value to the reference voltage to compensate for the additional resistance. Accordingly, in either example, the resistance test switch system of the IC 102 provides for a manner of accurately trimming the reference voltage by detecting and thereby mitigating the effect of additional resistance between a probe of the circuit test fixture and the first I/O lead.

Figure 2:
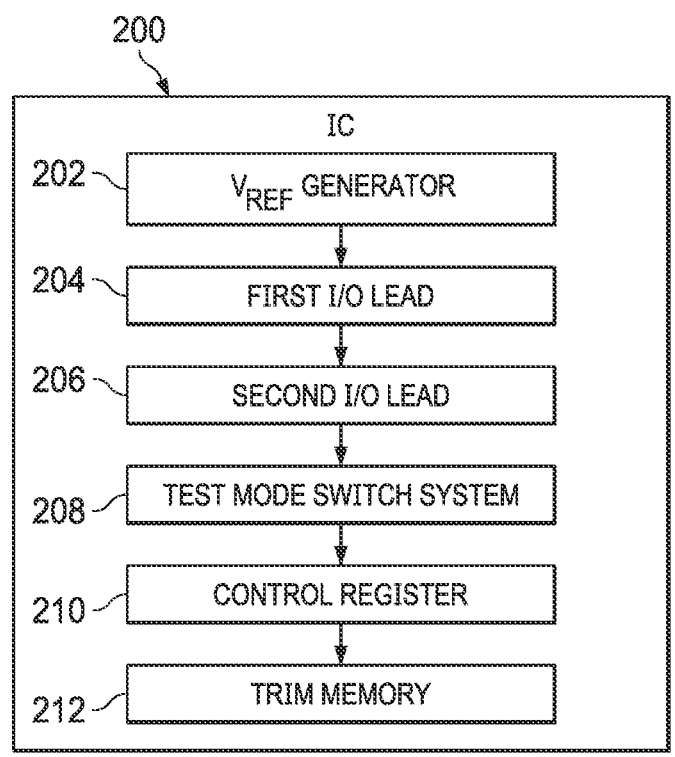
FIG. 2 is an example block diagram of an IC.

FIG. 2 is an example block diagram of an IC 200. The IC 200 can correspond to the IC 102 in the example of FIG. 1. Therefore, reference is to be made to the example of FIG. 1 in the following description of the example of FIG. 2.

The IC 200 includes a reference voltage generator ("$V_{REF}$ GENERATOR") 202 that is configured to generate a reference voltage $V_{REF}$. The reference voltage $V_{REF}$ can be a direct current (DC) voltage that is provided from the IC 200 to any of a variety of other circuits to provide a stable reference. The IC 200 also includes a first I/O lead 204 and a second I/O lead 206. During a normal operating mode, the reference voltage generator 202 can provide the reference voltage $V_{REF}$ as an output from the first I/O lead. The second I/O lead can be implemented for any of a variety of purposes of the IC 200 in the normal operating mode.

The IC 102 also includes a resistance test switch system 208, a control register 210, and a trim memory 212. The resistance test switch system 208 can be fabricated as part of the IC 200 to provide for accurate trimming of the reference voltage $V_{REF}$, as described herein. The control register 210 can be implemented to switch the resistance test switch system 208 between a test mode and a normal operating mode via the ATE 114 of the circuit test fixture 110. Therefore, in the test mode, the circuit test fixture 110 can measure the resistance between an associated hardware probe of the circuit test fixture 110 and the first I/O lead 204 to facilitate accurate trimming of the reference voltage generated by the reference voltage generator 202, as described herein.

As an example, the resistance test switch system 208 can include a resistor and a set of switches that can be controlled based on whether the IC 200 is set to the test mode or the normal operating mode. As described above, the ATE 114 of the circuit test fixture 110 can communicate with the control register 210 of the IC 200 to switch the resistance test switch system 208 between the test mode and the normal operating mode. As described herein, the description of switching the IC 200 between the test mode and the normal operating mode and switching the resistance test switch system 208 between the test mode and the normal operating mode are interchangeable. Thus, as described above in the example of FIG. 1, in response to the first and second I/O leads 204 and 206 being coupled to the circuit test fixture 110, the ATE 114 can switch the resistance test switch system 208 to the test mode.

In the test mode, a first switch of the resistance test switch system 208 can decouple the reference voltage generator 202 and the first I/O lead 204 and can couple the first I/O lead 204 to the second I/O lead 206 via the resistor. The circuit test fixture 110 can thus provide a signal (e.g., a current) through the resistor between the first and second I/O leads 204 and 206 to measure a resistance of the first and second I/O leads 204 and 206 relative to a resistance value of the resistor. Therefore, in response to determining that the measured resistance is approximately the same as the resistor, the circuit test fixture can determine that there is minimal contact resistance between the probe and the first I/O lead 204, thereby allowing accurate measurement of the reference voltage for accurate trimming of the reference voltage. However, if the circuit fixture determines that the measured resistance is different (e.g., greater) than the resistor, then the circuit test fixture 110 can determine that there is added resistance between the first I/O lead 204 and the probe, thereby prompting an adjustment of the hardware (e.g., cleaning the probe), as described above.

Figure 3:
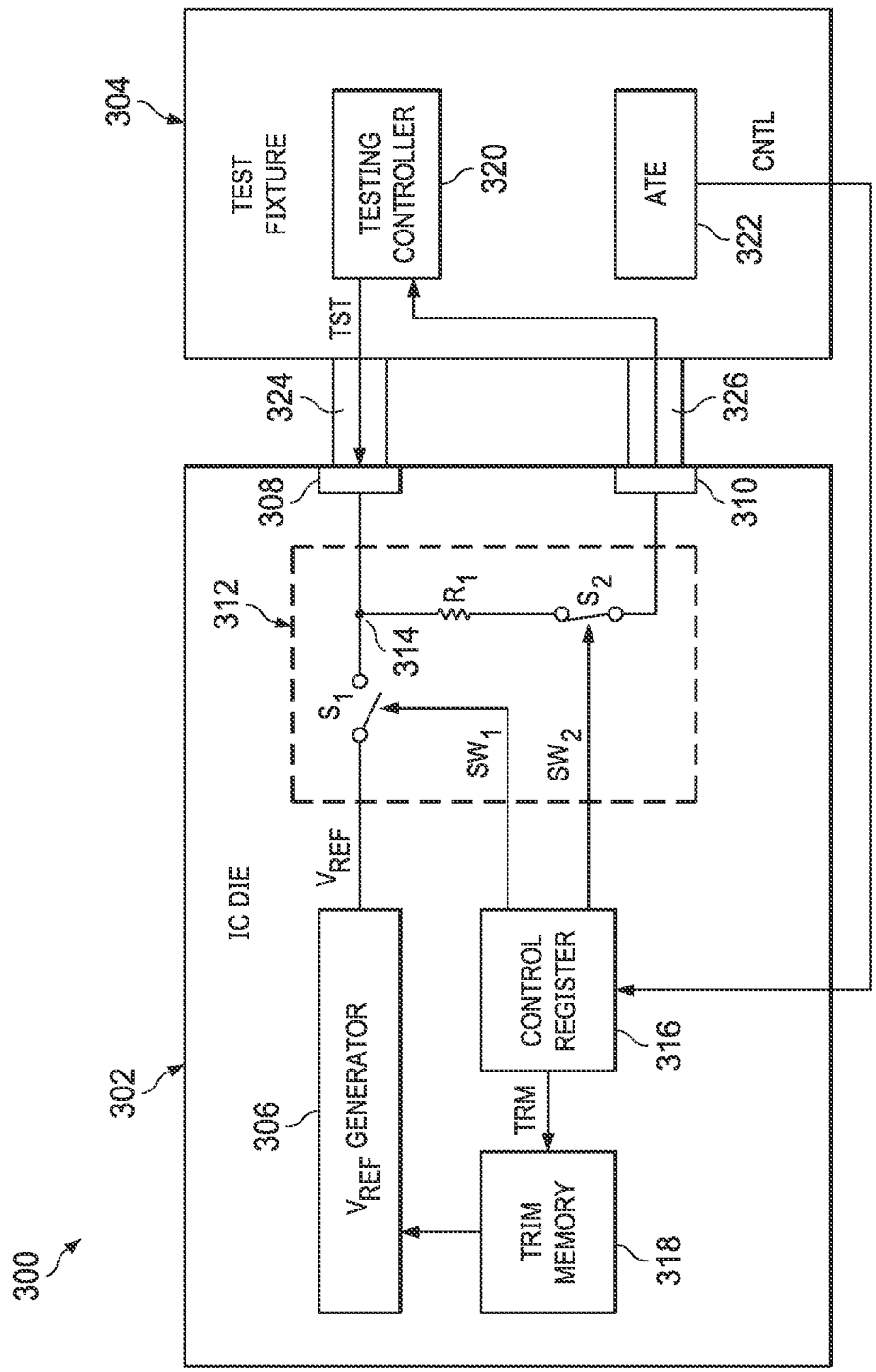
FIG. 3 is an example diagram of trimming a reference voltage.

FIG. 3 is an example diagram 300 of trimming a reference voltage $V_{REF}$. The diagram 300 includes an IC die 302 that can correspond to the IC 102/DUT 112 in the example of FIG. 1 and the IC 200 in the example of FIG. 2. The diagram 300 also includes a circuit test fixture 304 that can correspond to the circuit test fixture 110 in the example of FIG. 1. Therefore, reference is to be made to the examples of FIGS. 1 and 2 in the following description of the example of FIG. 3.

The IC die 302 includes a reference voltage generator ("$V_{REF}$ GENERATOR") 306 that is configured to generate a reference voltage $V_{REF}$. The IC die 302 also includes a first I/O lead 308 and a second I/O lead 310. In the example of FIG. 3, the I/O leads 308 and 310 can correspond to conductive pads on the IC die 302. The IC die 302 also includes a resistance test switch system 312. As described above, the resistance test switch system 312 can be switched to a normal operating mode in which the reference voltage generator 306 provides the reference voltage $V_{REF}$ as an output from the first I/O lead 308. As also described the resistance test switch system 312 can be switched to a test mode in which the resistance between a first probe 324 and the first I/O lead 308 can be measured to provide for accurate trimming of the reference voltage $V_{REF}$.

In the example of FIG. 3, the resistance test switch system 312 includes a first switch $S_1$, a second switch $S_2$, and a resistor $R_1$. The first switch $S_1$ interconnects the reference voltage generator 306 and the first I/O lead 308. Therefore, when the first switch $S_1$ is closed, the reference voltage generator 306 can provide the reference voltage $V_{REF}$ as an output on the first I/O lead 308. The second switch $S_2$ is coupled between the second I/O lead 310 and the resistor $R_1$, and the resistor $R_1$ is coupled to a node 314 that interconnects the first switch $S_1$ and the first I/O lead 308.

The IC die 302 also includes a control register 316 and a trim memory 318. The control register 316 is configured to communicate with the circuit test fixture 304. In the example of FIG. 3, the control register 316 is also configured to generate a first switching signal $SW_1$ that controls the operation of the first switch $S_1$ and a second switching signal $SW_2$ that controls the operation of the second switch $S_2$. As demonstrated in the example of FIG. 3, the switches $S_1$ and $S_2$ are demonstrated in opposite states in which the switch $S_1$ is open and the switch $S_2$ is closed. As described in greater detail herein, the state of the switches $S_1$ and $S_2$ is demonstrated in the example of FIG. 3 as the test mode. Alternatively, in the normal operating mode, the switch $S_1$ is closed and the switch $S_2$ is open, as described in greater detail herein. The control register 316 is also demonstrated as providing a trim signal TRM to the trim memory 318. The trim signal TRM can correspond to a trim value that is provided by the circuit test fixture 304, which can thus be stored in the trim memory 318. The trim memory 318 can thus provide the trim value TRM to the reference voltage generator 306, such that the reference voltage generator 306 can provide the desired amplitude of the reference voltage $V_{REF}$ in the normal operating mode.

The circuit test fixture 304 includes a testing controller 320 and ATE 322. After fabrication, the IC die 302 is coupled to the circuit test fixture 304 by coupling a first probe 324 of the circuit test fixture 304 to the first I/O lead 308 and a second probe 326 of the circuit test fixture 304 to the second I/O lead 310. The ATE 322 can also be communicatively coupled to the control register 316. The ATE 322 can thus set the IC die 302 to the test mode by providing a control signal CTRL to the control register 316. In response, the control register 316 can provide the switching signals $SW_1$ and $SW_2$ to control the respective switches $S_1$ and $S_2$ to the corresponding states for the test mode (as demonstrated in the example of FIG. 3). Therefore, the reference voltage generator 306 is decoupled from the first I/O lead 308, and the first and second I/O leads 308 and 310 are coupled via the resistor $R_1$.

The testing controller 320 can thus provide a test signal TST to one of the I/O leads 308 or 310 (demonstrated as the I/O lead 308 in the example of FIG. 3). As an example, the test signal TST can be a voltage signal or a current signal. The test signal TST thus has a signal path from the testing controller 320 through the first probe 324, through the first I/O lead 308, through the resistor $R_1$, through the second I/O lead 310, through the second probe 326, and back to the testing controller 320. The testing controller 320 can thus measure a resistance of the signal path of the test signal TST based on a measurable parameter of the test signal TST. For example, the test signal TST can be a voltage signal, such that the testing controller 320 can measure a current through the signal path of the test signal to determine the resistance of the signal path. As another example, the test signal TST can be a current signal, such that the testing controller 320 can measure a voltage across the first and second I/O leads 308 and 310 to determine the resistance of the signal path.

In response to measuring the resistance of the current path of the test signal TST, the testing controller 320 can compare the measured resistance of the current path with the resistance value of the resistor $R_1$. As an example, the testing controller 320 can determine if the measured resistance is within a threshold tolerance of the resistance value of the resistor $R_1$. If the measured resistance of the signal path of the test signal TST is within the threshold tolerance of the resistance value of the resistor $R_1$, then the testing controller 320 can determine that there is minimal (e.g., acceptable) contact resistance between the first probe 324 and the first I/O lead 308. Therefore, the circuit test fixture 304 can perform trimming of the reference voltage $V_{REF}$.

For example, in response to determining minimal (e.g., acceptable) contact resistance between the first probe 324 and the first I/O lead 308, the ATE 322 can switch the control register 316 to the normal operating mode via the control signal CTRL. Thus, the control register 316 can provide the switching signals $SW_1$ and $SW_2$ to control the respective switches $S_1$ and $S_2$ to the corresponding states for the normal operating mode (opposite as demonstrated in the example of FIG. 3). Therefore, the reference voltage generator 306 is coupled to the first I/O lead 308, and the first and second I/O leads 308 and 310 are decoupled. The testing controller 320 can thus monitor the amplitude of the reference voltage $V_{REF}$ at the first I/O lead 308 via the first probe 324. Based on the amplitude of the reference voltage $V_{REF}$, the ATE 322 can provide a trimming value to the control register 316 via the control signal CTRL. The control register 316 can thus save the trim value TRM to the trim memory 318.

However, if the measured resistance of the signal path of the test signal TST is outside (e.g., greater than) the threshold tolerance of the resistance value of the resistor $R_1$, then the testing controller 320 can determine that there is significant (e.g., unacceptable) contact resistance between the first probe 324 and the first I/O lead 308. Therefore, the circuit test fixture 304 prompt one or more user(s) to adjust the hardware of the circuit test fixture 304. For example, the user(s) can be prompted to clean the probes 324 and 326 and/or can verify proper operation of the circuit test fixture 304 (e.g., of the testing controller 320). After adjustment of the hardware of the circuit test fixture 304, the process can be repeated. Thus, the ATE 322 can set the control register 316 back to the test mode to perform another measurement of the contact resistance between the first probe 324 and the first I/O lead 308. Accordingly, the reference voltage $V_{REF}$ can be trimmed only if the contact resistance is acceptable, thereby providing for a more accurate trimming of the reference voltage $V_{REF}$.

Figure 4:
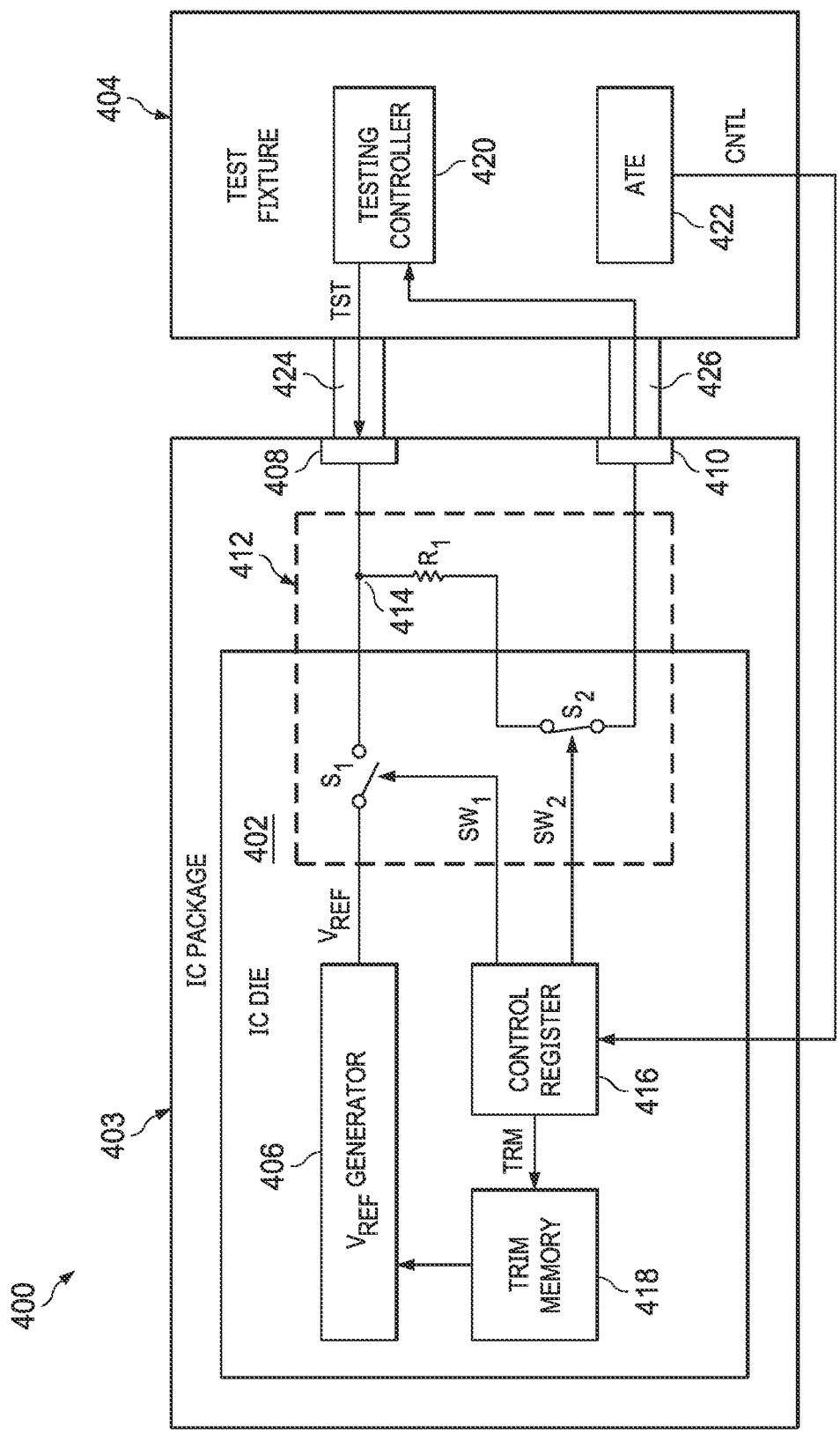
FIG. 4 is another example diagram of trimming a reference voltage.

FIG. 4 is another example diagram 400 of trimming a reference voltage $V_{REF}$. The diagram 400 includes an IC die 402 and an IC package 403 that can collectively correspond to the IC 102/DUT 112 in the example of FIG. 1 and the IC 200 in the example of FIG. 2. The diagram 400 also includes a circuit test fixture 404 that can correspond to the circuit test fixture 110 in the example of FIG. 1. Therefore, reference is to be made to the examples of FIGS. 1 and 2 in the following description of the example of FIG. 4.

The IC die 402 includes a reference voltage generator ("$V_{REF}$ GENERATOR") 406 that is configured to generate a reference voltage $V_{REF}$. The IC package 403 includes a first I/O lead 408 and a second I/O lead 410. In the example of FIG. 4, the I/O leads 408 and 410 can correspond to conductive pins external to the IC package 403. The conductive pins corresponding to the I/O leads 408 and 410 can, for example, be conductively coupled to pads associated with the IC die 402. The IC die 402 also includes a resistance test switch system 412. As described above, the resistance test switch system 412 can be switched to a normal operating mode in which the reference voltage generator 406 provides the reference voltage $V_{REF}$ as an output from the first I/O lead 408. As also described the resistance test switch system 412 can be switched to a test mode in which the resistance between a probe of the circuit test fixture 404 and the first I/O lead 408 can be measured to provide for accurate trimming of the reference voltage $V_{REF}$.

In the example of FIG. 4, the resistance test switch system 412 includes a first switch $S_1$, a second switch $S_2$, and a resistor $R_1$. The first switch $S_1$ interconnects the reference voltage generator 406 and the first I/O lead 408. Therefore, when the first switch $S_1$ is closed, the reference voltage generator 406 can provide the reference voltage $V_{REF}$ as an output on the first I/O lead 408. The second switch $S_2$ is coupled between the second I/O lead 408 and the resistor $R_1$, and the resistor $R_1$ is coupled to a node 414 that interconnects the first switch $S_1$ and the first I/O lead 408. In the example of FIG. 4, the switches $S_1$ and $S_2$ can be fabricated as part of the IC die 402. However, the resistor $R_1$ can be arranged external to the IC die 402 but within the IC package 403. Such an arrangement can provide for a more compact form-factor of the IC die 402 with minimal wiring to provide the resistor $R_1$ within the IC package 403.

The IC die 402 also includes a control register 416 and a trim memory 418. The control register 416 is configured to communicate with the circuit test fixture 404. In the example of FIG. 4, the control register 416 is also configured to generate a first switching signal $SW_1$ that controls the operation of the first switch $S_1$ and a second switching signal $SW_2$ that controls the operation of the second switch $S_2$. As demonstrated in the example of FIG. 4, the switches $S_1$ and $S_2$ are demonstrated in opposite states in which the switch $S_1$ is open and the switch $S_2$ is closed. As described in greater detail herein, the state of the switches $S_1$ and $S_2$ is demonstrated in the example of FIG. 4 as the test mode. Alternatively, in the normal operating mode, the switch $S_1$ is closed and the switch $S_2$ is open, as described in greater detail herein. The control register 416 is also demonstrated as providing a trim signal TRM to the trim memory 418. The trim signal TRM can correspond to a trim value that is provided by the circuit test fixture 404, which can thus be stored in the trim memory 418. The trim memory 418 can thus provide the trim value TRM to the reference voltage generator 406, such that the reference voltage generator 406 can provide the desired amplitude of the reference voltage $V_{REF}$ in the normal operating mode.

The circuit test fixture 404 includes a testing controller 420 and ATE 422. After fabrication, the IC die 402 is coupled to the circuit test fixture 404 by coupling a first probe 424 of the circuit test fixture 404 to the first I/O lead 408 and a second probe 426 of the circuit test fixture 404 to the second I/O lead 410. The ATE 422 can also be communicatively coupled to the control register 416. The ATE 422 can thus set the IC die 402 to the test mode by providing a control signal CTRL to the control register 416. In response, the control register 416 can provide the switching signals $SW_1$ and $SW_2$ to control the respective switches $S_1$ and $S_2$ to the corresponding states for the test mode (as demonstrated in the example of FIG. 4). Therefore, the reference voltage generator 406 is decoupled from the first I/O lead 408, and the first and second I/O leads 408 and 410 are coupled via the resistor $R_1$.

The measurement of the contact resistance between the first probe 424 and the first I/O lead 408 can be the same as described above in the example of FIG. 3. For example, the testing controller 420 can thus provide a test signal TST to one of the I/O leads 408 or 410 (demonstrated as the I/O lead 408 in the example of FIG. 4). As an example, the test signal TST can be a voltage signal or a current signal. The test signal TST thus has a signal path from the testing controller 420 through the first probe 424, through the first I/O lead 408, through the resistor $R_1$, through the second I/O lead 410, through the second probe 426, and back to the testing controller 420. The testing controller 420 can thus measure a resistance of the signal path of the test signal TST based on a measurable parameter of the test signal TST. For example, the test signal TST can be a voltage signal, such that the testing controller 420 can measure a current through the signal path of the test signal to determine the resistance of the signal path. The results of the measurement of the contact resistance for purposes of trimming the reference voltage $V_{REF}$ can likewise be the same as described above in the example of FIG. 3. Accordingly, the reference voltage $V_{REF}$ can be trimmed only if the contact resistance is acceptable, thereby providing for a more accurate trimming of the reference voltage $V_{REF}$.

Figure 5:
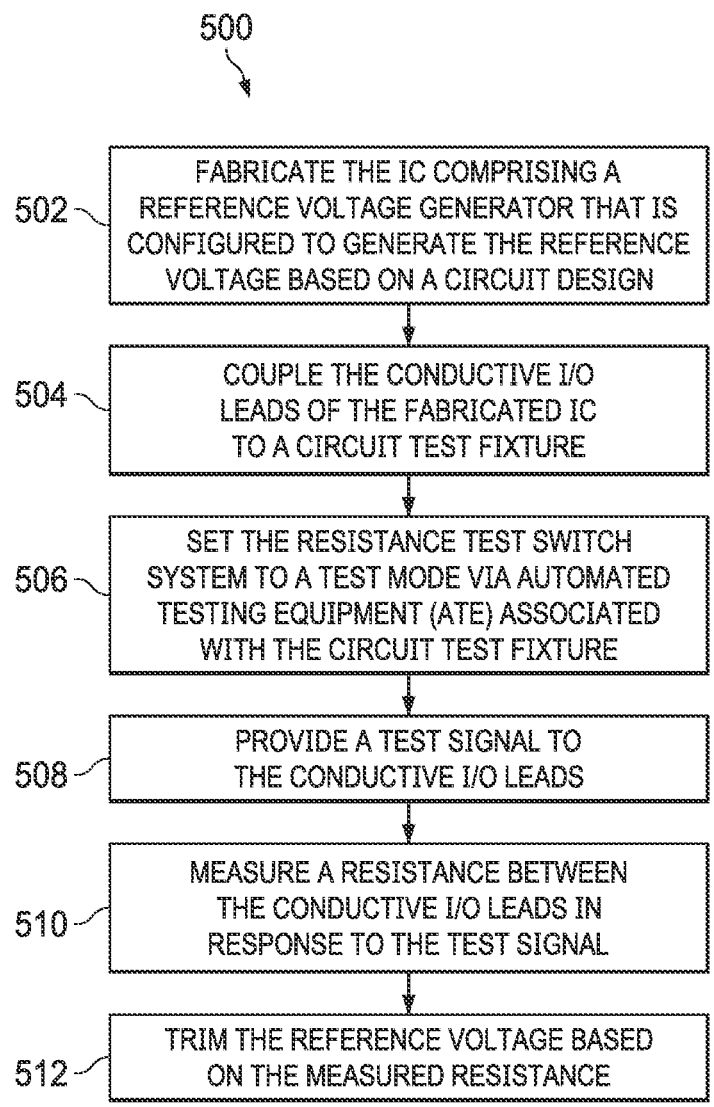
FIG. 5 is an example of a method for trimming a reference voltage in an IC.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

FIG. 5 illustrates an example of a method 500 for trimming a reference voltage (e.g., the reference voltage $V_{REF}$) in an IC (e.g., the IC 102). At 502, the IC configured to generate the reference voltage is fabricated based on a circuit design. The fabricated IC can include a pair of conductive I/O leads (e.g., the I/O leads 204 and 206) and a resistance test switch system (e.g., the resistance test switch system 208) coupled between the conductive I/O leads. At 504, the conductive I/O leads of the fabricated IC are coupled to a circuit test fixture (e.g., the circuit test fixture 110). At 506, the resistance test switch system is set to a test mode via ATE (e.g., the ATE 114) associated with the circuit test fixture. At 508, a test signal (e.g., the test signal TST) is provided to the conductive I/O leads. At 510, a resistance between the conductive I/O leads is measured in response to the test signal. At 512, the reference voltage is trimmed based on the measured resistance.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A method for trimming a reference voltage in an integrated circuit (IC), the method comprising:
   fabricating the IC comprising a reference voltage generator that is configured to generate the reference voltage based on a circuit design, the fabricated IC further comprising a pair of conductive input/output (I/O)

leads and a resistance test switch system coupled between the conductive I/O leads;
coupling the conductive I/O leads of the fabricated IC to a circuit test fixture;
setting the resistance test switch system to a test mode via automated testing equipment (ATE) associated with the circuit test fixture;
providing a test signal to the conductive I/O leads;
measuring a resistance between the conductive I/O leads in response to the test signal; and
trimming the reference voltage based on the measured resistance.

2. The method of claim 1, wherein the resistance test switch system comprises a resistor coupled between the conductive I/O leads in the test mode, the resistor having a predefined resistance, wherein measuring the resistance comprises measuring the resistance between the conductive I/O leads in response to the test signal relative to the predefined resistance of the resistor.

3. The method of claim 2, further comprising comparing the measured resistance between the conductive I/O leads with a threshold tolerance associated with the predefined resistance, wherein trimming the reference voltage comprises trimming the reference voltage in response to the measured resistance being less than the threshold tolerance.

4. The method of claim 3, further comprising adjusting probe hardware associated with the circuit test fixture in response to the measured resistance being greater than the threshold tolerance, wherein trimming the reference voltage comprises trimming the reference voltage after adjusting the probe hardware.

5. The method of claim 3, wherein trimming the reference voltage comprises trimming the reference voltage with a correction factor based on a difference between the measured resistance and the predefined resistance in response to the measured resistance being greater than the threshold tolerance.

6. The method of claim 2, wherein the fabricated IC comprises an IC die and an IC package that substantially encloses the IC die, wherein the resistor is arranged within the IC package external to the IC die.

7. The method of claim 6, wherein the conductive I/O leads are conductive pins of the IC package.

8. The method of claim 6, wherein the resistance test switch system comprises:
a first switch coupled between the reference voltage generator and a first one of the conductive I/O leads; and
a second switch coupled between the resistor and the second one of the conductive I/O leads, wherein the first and second switches are fabricated in the IC die.

9. The method of claim 1, wherein the resistance test switch system comprises:
a first switch coupled between the reference voltage generator and a first one of the conductive I/O leads;
a resistor; and
a second switch coupled in series between the first one of the conductive I/O leads and the second one of the conductive I/O leads.

10. The method of claim 9, wherein setting the resistance test switch system to the test mode comprises opening the first switch and closing the second switch in the test mode via the ATE, the method further comprising closing the first switch and opening the second switch in a normal operating mode after trimming the reference voltage.

11. An integrated circuit (IC) comprising:
a reference voltage generator configured to provide a reference voltage;
a first conductive I/O lead on which the reference voltage is provided during a normal operating mode;
a second conductive I/O lead;
a resistance test switch system comprising a set of switches coupled to the reference voltage generator and the first and second conductive I/O leads;
a control register that is adapted to be coupled to automated testing equipment (ATE) to control the set of switches between the normal operating mode and a test mode; and
a trim memory configured to save a trimming value associated with the reference voltage provided via the ATE in response to a determination of a resistance between the first and second conductive I/O leads during the test mode via a circuit test fixture.

12. The IC of claim 11, wherein the resistance test switch system comprises:
a first switch coupled between the reference voltage generator and the first conductive I/O lead;
a resistor; and
a second switch coupled between the resistor and the second conductive I/O lead.

13. The IC of claim 12, wherein the control register is configured to close the first switch to couple the reference voltage generator and the first conductive I/O lead in the normal operating mode and to open the second switch to decouple the first and second conductive I/O leads in the normal operating mode, and is configured to open the first switch to decouple the reference voltage generator and the first conductive I/O lead and to close the second switch to couple the first and second conductive I/O leads via the resistor in the test mode.

14. The IC of claim 12, wherein the IC further comprises:
an IC die that includes the reference voltage generator, the control register, and the trim memory; and
an IC package that substantially encloses the IC die, wherein the resistor is arranged within the IC package external to the IC die.

15. The system of claim 14, wherein the first and second conductive I/O leads are conductive pins of the IC package.

16. A method for fabricating an integrated circuit (IC), the method comprising:
forming an IC die, the IC die comprising:
a reference voltage generator configured to provide a reference voltage;
a first conductive I/O lead on which the reference voltage is provided during a normal operating mode;
a second conductive I/O lead;
a resistance test switch system comprising a set of switches coupled to the reference voltage generator and the first and second conductive I/O leads;
a control register that is adapted to be coupled to automated testing equipment (ATE) to control the set of switches between the normal operating mode and a test mode; and
a trim memory configured to save a trimming value associated with the reference voltage provided via the ATE in response to a determination of a resistance between the first and second conductive I/O leads during the test mode via a circuit test fixture; and
enclosing the IC die in an IC package, the IC package comprising a first pin conductively coupled to the first conductive I/O lead and a second pin conductively coupled to the second conductive I/O lead.

17. The method of claim 16, wherein forming the IC die comprises forming the resistance test switch system comprising:
- a first switch coupled between the reference voltage generator and the first conductive I/O lead; and
- a second switch coupled between the first and second conductive I/O leads.

18. The method of claim 17, wherein forming the IC die comprises forming the control register to be configured to control the first and second switches, such that control register is configured to close the first switch to couple the reference voltage generator and the first conductive I/O lead in the normal operating mode and to open the second switch to decouple the first and second conductive I/O leads in the normal operating mode, and is configured to open the first switch to decouple the reference voltage generator and the first conductive I/O lead and to close the second switch to couple the first and second conductive I/O leads in the test mode.

19. The method of claim 18, wherein forming the IC die comprises forming the resistance test switch system comprising a resistor having a predefined resistance, wherein the control register is configured to open the first switch to decouple the reference voltage generator and the first conductive I/O lead and to close the second switch to couple the first and second conductive I/O leads via the resistor in the test mode.

20. The method of claim 16, wherein forming the IC die comprises forming the resistance test switch system comprising a resistor having a predefined resistance, wherein the trim memory is configured to save the trimming value associated with the reference voltage provided via the ATE in response to the determination of the resistance between the first and second conductive I/O leads relative to the predefined resistance during the test mode via the circuit test fixture.

* * * * *